United States Patent [19]
Bischoff

[11] 4,454,014
[45] Jun. 12, 1984

[54] ETCHED ARTICLE

[75] Inventor: Peter G. Bischoff, Cupertino, Calif.

[73] Assignee: Memorex Corporation, Santa Clara, Calif.

[21] Appl. No.: 455,367

[22] Filed: Jan. 3, 1983

Related U.S. Application Data

[63] Continuation of Ser. No. 212,359, Dec. 3, 1980.

[51] Int. Cl.³ .................... C23C 15/00; C25F 3/00; C25F 5/00
[52] U.S. Cl. ............................ 204/129.65; 156/643; 156/650; 156/651; 156/652; 156/656; 156/657; 204/15; 204/129.4; 204/192 E; 204/192 M; 360/122; 360/126
[58] Field of Search ............... 204/15, 129.4, 129.65, 204/192 E, 192 M; 156/650, 643, 659.1, 651, 656, 657, 652; 360/126, 122

[56] References Cited

U.S. PATENT DOCUMENTS

| | | | |
|---|---|---|---|
| 3,745,094 | 7/1973 | Greene | 204/15 |
| 3,853,715 | 12/1974 | Romankin | 204/15 |
| 3,878,006 | 4/1975 | Rice | 156/659.1 |
| 3,878,007 | 4/1975 | Feldstein et al. | 156/659.1 |
| 3,901,770 | 8/1975 | Littwin | 156/659.1 |
| 4,131,525 | 12/1978 | Tijburg et al. | 204/129.65 |
| 4,260,450 | 4/1981 | Neu | 360/126 |
| 4,274,935 | 6/1981 | Schmelzer | 204/192 M |
| 4,315,985 | 2/1982 | Castellani et al. | 204/15 |
| 4,369,477 | 1/1983 | Hanaoka | 360/126 |

Primary Examiner—Arthur P. Demers
Attorney, Agent, or Firm—John J. McCormack; Nathan Cass; Kevin R. Peterson

[57] ABSTRACT

A method for fabricating a metallic pattern on a substrate is disclosed. The method consists of depositing an adhesive and/or plating base material on a substrate upon which a narrow self-supporting border of photoresist is applied. An anodic layer is then deposited and the photoresist removed. The adhesive and plating base material is etched in those areas previously covered by the photoresist and fresh photoresist applied to encapsulate those areas of the anodic layer which form the final pattern of interest. The unwanted anodic material is then etched and the photoresist removed.

58 Claims, 7 Drawing Figures

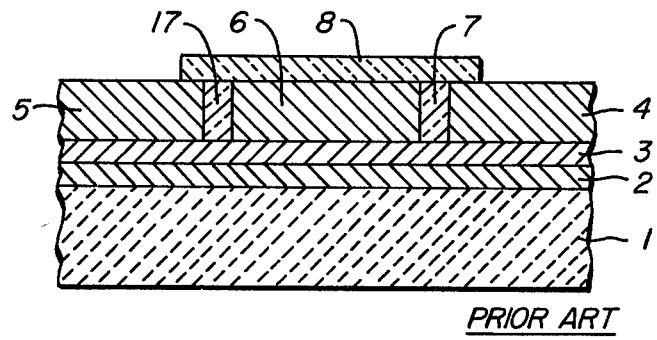
FIG._1. PRIOR ART
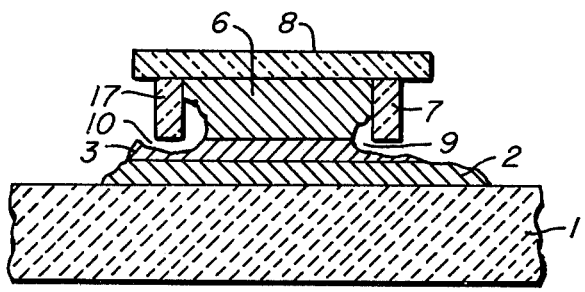
FIG._2. PRIOR ART
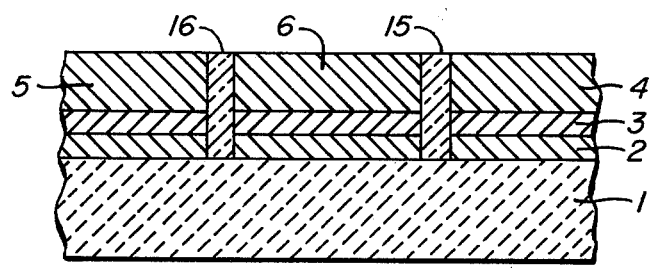
FIG._3.
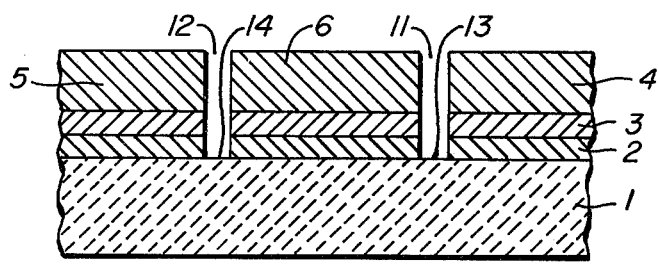
FIG._4.

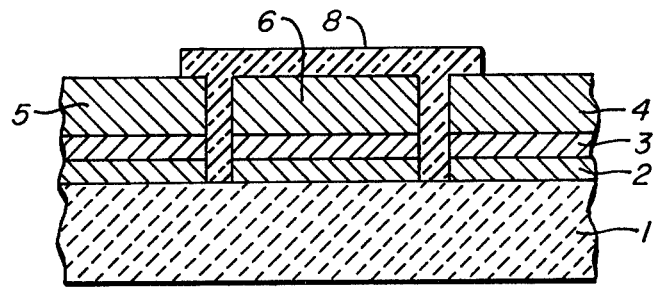
FIG._5.
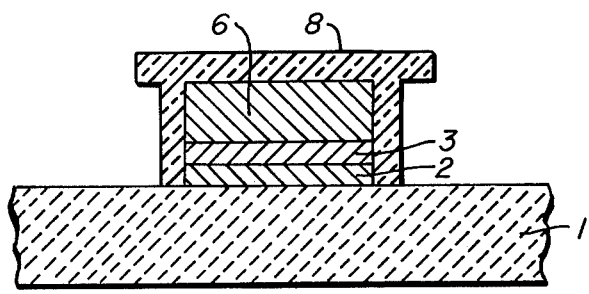
FIG._6.
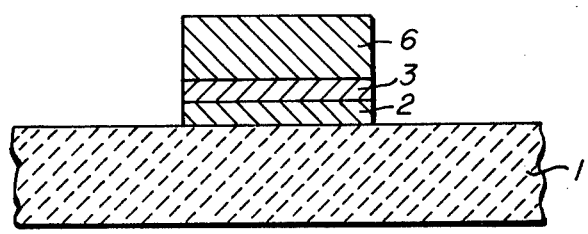
FIG._7.

ETCHED ARTICLE

This is a continuation of application Ser. No. 212,359, filed Dec. 3, 1980.

BACKGROUND OF THE INVENTION

When fabricating the pole pieces of thin film magnetic recording heads or other high tolerance elements, new techniques have developed in electroplating and etching sheet materials whose composition and structure must be accurately controlled in order to achieve uniformity of performance. As taught in U.S. Pat. No. 3,853,715, conventional masking techniques are quite ineffective in producing these elements.

What has been done in the prior art, in dealing with the plating of an alloy, such as Permalloy, a mixture of nickel and iron, was to plate the alloy in sheet form and then etch the sheet into desired patterns. However, when depositing films by electroplating, it is necessary to employ an adhesive layer between the alloy and the substrate that will support the alloy pattern. Since on certain adhesive layers it is not possible to electroplate, it is at times necessary to deposit a thin layer of fairly noble metal, such as Au, Pt, Pd, Cu, Ni, etc. on the adhesion layer.

Unfortunately, many adhesive and plating base layers that are compatible with the magnetic alloy in the substrate become cathodic to the alloy during etching, producing severe undercutting. For example, nickel-iron alloy is made adhesive to glass or silicon by interposing a thin layer of chromium or titanium between the nickel iron alloy and its associated substrate. As taught in U.S. Pat. No. 3,853,715, when such plural layers are etched, a severe undercut is observed in the etched material. Such undercutting is due to several separate effects taking place during etching and is neither reproducible nor controllable. The undercutting is due to the fact that the chemical etching is an accelerated form of corrosion. The corrosion is isotropic in principle; it should take place at equal rates both normal to the thickness of the etched metal and parallel to the thickness. This results in uniform undercutting of the metal. But due to the extremely small film thicknesses and pattern dimensions, the dimensions of the metal crystallites and grain cannot be ignored. The grain boundaries and grains etch at different rates, resulting in ragged edges.

During the terminal stages of etching, when the adhesive and/or the plating base metal layers are exposed, the dissimilar metals form a galvanic cell which results in extremely rapid etching of the anodic metal. In case of titanium and chromium, each of these metals passivate extremely quickly and becomes cathodic to nickel, nickel-iron and to the metals of the iron group. When the metals such as platinum, palladium, gold or copper are present in the sandwich with the iron group metals, they act cathodically and the etching of the nickel, nickel-iron alloy, etc. is impossible to control.

Such undercutting is detrimental to the making of batch-fabricated arrays, such as the pole pieces of thin film magnetic heads.

U.S. Pat. No. 3,853,715 recognizes the above-described difficulties and teaches a solution. In order to achieve uniform etching of multi-layered electroplated metals without undercutting, the patent teaches placement of a very narrow border of photoresist on top of the cathodic adhesive metal layer prior to electroplating the anodic metal. The narrow border closes upon itself to serve as a frame, while a second photoresist layer is deposited and developed so as to be present only over the anodic material to be retained after etching. The second photoresist overlaps the first photoresist to completely encapsulate the anodic layer. It is taught that subsequent etching of the surplus anodic material not needed in the ultimate pattern leaves the desired portions of the pattern free from attack, avoiding the undercutting that occurs when two or more dissimilar metals are subject to a common etchant.

It has now been found that the prior art solution to the problem of undercutting is not entirely adequate. More specifically, it has been determined that after the electroplated anodic material, such as Ni—Fe alloy, has been etched away, the etchant then has access to the cathodic metal/adhesive layers and lateral etching occurs below the border photoresist. Once this begins to occur, the adhesive maintaining the photoresist in place loses its structural integrity and the photoresist begins to remove from the substrate further compounding the undercutting problem.

DESCRIPTION OF THE INVENTION

In order to substantially eliminate the problem of undercutting, the present invention places a very narrow border of photoresist to define the later formed electrodeposited anodic material, such as Permalloy. Although the prior art, namely, U.S. Pat. No. 3,853,715, also uses a border of photoresist, the present invention differs therefrom in completely encapsulating the anodic material by photoresist which extends all the way to the inert substrate. Like the prior art, the present invention places the narrow border of photoresist on the cathodic metal/adhesive layer in a very narrow border region of width and dimension intended to define the final metal product being produced. After the photoresist is formed, the anodic material is deposited on the cathodic metal/adhesive underlayer and the photoresist then removed to expose said cathodic metal/adhesive underlayer only in those regions previously covered by the narrow self-supporting border of photoresist. The cathodic metal/adhesive underlayer is then removed in these exposed regions and photoresist is then re-applied extending all the way to the inert support and covering and thus encapsulating the anodic material intended as the final product.

By practicing the present invention, the photoresist acts as a substantially impermeable barrier to lateral etching, thus substantially eliminating the problem of undercutting. The corrosive etching is allowed to travel along the cathodic metal/adhesive underlayer, but when the etchant confronts the photoresist, a barrier is encountered terminating the etching process.

DESCRIPTION OF THE DRAWINGS

FIGS. 1 and 2 show prior art processing steps as taught in U.S. Pat. No. 3,853,715.

FIGS. 3–7 show the sequential processing steps for the elimination of undercutting during chemical etching according to the present invention.

DETAILED DESCRIPTION OF THE INVENTION

FIG. 1 shows an electroplated sheet being processed whereby substrate 1 of silicon dioxide, glass or other similar self-supporting insulating material is caused to support a thin layer of adhesion metal 2, such as chromium, titanium, tantalum, tungsten, niobium, vanadium or zirconium. Such adhesive metal 2 is used primarily to make the main metal of interest such as Ni—Fe alloy, referred to as the anodic metal, adherant to the substrate. Since one cannot readily electroplate or electrolessly plate on such adhesion layer, it is desirable to sequentially metallize the adhesion layer 2 with readily plateable metal 3, such as Au, Pt, Pd, Cu, Ni, Ni—Fe or with a metal alloy. Such adhesion layer 2 and conductive layer 3 can be applied by sputtering, evaporating, or in any other manner.

According to the prior art, at this stage of the processing sequence, photoresist 7 and 17 is deposited by conventional lithographic techniques and the anodic material 6 such as Permalloy is deposited.

After the plating of the Permalloy layer 6, another photoresist layer 8 is applied by conventional photolithographic techniques to the top of anodic metal 6. The excess anodic material shown as areas 4 and 5 of FIG. 1 is then etched away, FeCl₃ being a suitable etchant for Ni—Fe, the photoresist borders 7, 17 and 8 encapsulating the anodic material.

The prior art teaches that the photoresist prevents the active metal such as Ni—Fe from being etched, while in the presence of cathodic metal, such as chromium, titanium, gold, etc. After the more active metal 6 was etched with FeCl₃, it is taught that the plating base metal 3 and adhesion layer 2 are etched with suitable chemical etchants. As stated previously, however, it has been discovered that etchants used to remove non-wanted anodic areas 4 and 5 together with plating base metal 3 and adhesion layer 2 laterally etch layers 2 and 3 below photoresist boundary areas 7 and 17 causing serious undercutting and loss of sharp edge etching as shown in FIG. 2 at 9 and 10. Once lateral etching begins, photoresist areas 7 and 17 lose their adhesion to supporting layers 2 and 3, which further aggrevates the problem. Furthermore, because of the difference in electrochemical potentials between the adhesion metal layer 2, such as titanium, and the anodic metal, such as Ni—Fe, a battery is formed as soon as the adhesive metal layer is exposed to the etchant, and the etch rate of the Ni—Fe is increased to such an extent that it makes control of the etching process very difficult if not impossible.

In order to overcome these difficulties, reference is made to FIGS. 3–7. FIG. 3 shows the processing which would be substantially equivalent to the prior art at an equivalent point in its processing cycle. More specifically, upon adhesive metal layer 2 and plateable metal layer 3 has been applied a very narrow border of photoresist shown as elements 15, 16. The anodic layer is then deposited upon metal layer 3 as a uniform coating shown as regions 4, 5 and 6. It is region 6 which is intended to be the pattern of interest as the final product and its configuration is defined by the very narrow self-supporting border of photoresist 15, 16.

Unlike the prior art, the border of photoresist 15, 16 is now removed by any well known technique, thus exposing adhesive metal layer 2 and plateable metal layer 3 selectively in those areas which were defined by the very narrow self-supporting border of photoresist. As shown in FIG. 4, adhesive metal layer 2 and plateable metal layer 3 are selectively removed by any well known technique, such as by sputter etching or ion milling, resulting in voids 11 and 12 extending all the way to base 1 at 13, 14. These voids, preferably approximately 0.1 to 0.2 mils wide, define the final pattern or patterns of anodic material, which will become, for example, the pole pieces of thin film magnetic heads.

The voids 11, 12 are filled with photoresist 8 which is caused to completely encapsulate anodic material 6 on three sides with the fourth side of this region being encapsulated by inert base 1.

As shown in FIG. 5, photoresist 8 can extend slightly beyond filled voids 11, 12. The excess anodic material 4, 5, such as electrodeposited Permalloy, is then etched away, FeCl₃ being a suitable etchant for Fe—Ni alloy. Plating base metal 3 and adhesive layer 2 can be etched with suitable chemical etchants. Because photoresist 8 is in physical contact with support base 1, the etching of areas 4 and 5, as well as layers 2 and 3, does not in any way adversely effect the sharp edge integrity of the anodic metal or support layers 2 and 3 located within the boundaries defined by photoresist 8 (FIG. 6). The photoresist material 8 is lastly removed by any well known technique resulting in the final sharp-edge pattern, unattainable in the prior art (FIG. 7).

The teachings of U.S. Pat. No. 3,853,715 including preferred photoresist materials as well as etchants are hereby incorporated by reference herein. While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating a metallic pattern on a substrate comprising the steps of:
   a. depositing a first thin metallic layer on an inert substrate;
   b. depositing a very narrow self-supporting border of a given height of photoresist material on such metallic layer, said border outlining the configuration of a pattern of interest of a subsequent second metal to be deposited on said thin metallic layer, said subsequent second metal becoming anodic with said first metallic layer during its etching;
   c. depositing said second metal on said first metal,
   d. removing said self-supporting border of photoresist exposing said first thin metallic layer;
   e. removing said first thin metallic layer in those areas exposed in step d;
   f. depositing photoresist to substantially cover the pattern of interest and to substantially fill the regions previously occupied by the self-supporting border of photoresist to thus substantially encapsulate the second metal within the pattern of interest; and
   g. etching away all the anodic material not encapsulated.

2. A method for fabricating a metallic pattern on a substrate comprising the steps of:
   a. depositing an adhesive and/or plating base material which becomes cathodic during a subsequent etching process on an inert substrate;
   b. placing a very narrow self-supporting border of a given height of photoresist material on such cathodic material, said border outlining the configuration of a pattern of interest of subsequent anodic material to be deposited on said cathodic material;
   c. depositing anodic material on said cathodic material;
   d. removing said self-supporting border of photoresist exposing said cathodic material;

e. removing the cathodic material in those areas exposed in step d;

f. depositing photoresist to substantially cover the pattern of interest and to substantially fill the regions previously occupied by the self-supporting border of photoresist to thus substantially encapsulate the anodic material within the pattern of interest; and g. etching away all the anodic material not encapsulated.

3. The method of claims 1 or 2 wherein the anodic material not encapsulated is removed by chemical etching.

4. The method of claim 1 wherein the first thin metallic layer is removed by back-sputter etching in those areas exposed by removal of the self-supporting border of photoresist.

5. The method of claim 1 wherein the first thin metallic layer is removed by in milling in those areas exposed by removal of the self-supporting border of photoresist.

6. The method of claim 2 wherein substantially all adhesive and plating base material is removed by back-sputter etching in those areas exposed by removal of the self-supporting border of photoresist.

7. The method of claim 2 wherein substantially all adhesive and plating base material is removed by ion milling in those areas exposed by removal of the self-supporting border of photoresist.

8. The methods of claims 1 or 2 wherein the anodic material comprises an alloy of nickel and iron.

9. A pole piece for a thin film head made by the method of claims 1 or 2.

10. The method of claim 1 wherein said second metal is electroplated on said first metal.

11. The method of claim 2 wherein said anodic material is electroplated on said adhesive and/or plating base material.

12. The method of claim 1 wherein said second metal is deposited upon said first metal to a height that is substantially no greater than the height of the self-supporting border of photoresist.

13. The method of claim 2 wherein said anodic material is deposited upon said cathodic material to a height that is substantially no greater than the height of the self-supporting border of photoresist.

14. The method of claims 1 or 2 wherein said narrow area is approximately 0.1 to 0.2 mils wide.

15. A novel in-process pattern for a thin film transducer comprising:

at least one first thin layer on a relatively non-etchable substrate;

deposit of a second thin metal film on said first metal(s); this second metal being characterized in tending to become anodic with said first metallic layer(s) during etching; and deposit of photoresist adapted and located to substantially cover the pattern of interest and to substantially fill the regions previously occupied by a prescribed previously applied photoresist border down to the substrate, whereby to encapsulate the first metal substantially completely within the pattern of interest except for its contact area with the substrate; the second metal being etched-away where it is not so encapsulated; said photoresist being subject to subsequent removal.

16. The combination as recited in claim 15 wherein the first metallic layers comprise a layer of adhesion-metal applied on the substrate and a layer of plateable metal applied on the layer of adhesion-metal.

17. The combination as recited in claim 16 wherein the second metal is magnetic and relatively anodic.

18. The combination as recited in claim 17 wherein the second metal comprises a thin layer of magnetic ferrous metal.

19. The combination as recited in claim 18 wherein the "adhesion-metal" comprises a metal such as Cr, Ti, Ta, Wf, Ni, Van or Zr, apt for joining said ferrous metal firmly to the substrate.

20. The combination as recited in claim 19 wherein the substrate surface is comprised of a non-metal and the "plateable metal" layer comprises Au, Pt, Pd, Cu, Ni, Fe, and alloys thereof or like metal, and tends to be relatively more plateable than said adhesion metal.

21. The combination as recited in claim 20 wherein the substrate surface comprises glass or a similar non-metal and the second metal includes Ni and Fe.

22. The combination of claim 21 wherein the adhesion metal and plateable metal layer(s) have been "back-sputter etched" in those areas exposed by prior removal of a prescribed border of photoresist.

23. The combination of claim 19 wherein certain portions of the first metallic layer(s) have been removed by ion milling in those areas exposed by prior removal of a prescribed border of photoresist.

24. The combination of claim 23 wherein a prescribed locus of adhesion and plateable metal has been removed, down to the substrate, by back-sputter etching in areas exposed by prior removal of a prescribed border of photoresist.

25. The combination of claim 23 wherein a prescribed portion of adhesion and plateable metal has been removed by ion milling in certain areas exposed by prior removal of a prescribed border of photoresist.

26. The combination of claim 20 wherein the anodic material comprises an alloy of nickel and iron laid down in a very thin film.

27. The combination as in claim 26, configured as a pole piece for a thin film head.

28. The combination of claim 15 wherein said second metal is electroplated on said first metal.

29. The combination of claim 17 wherein said anodic material is electroplated on said adhesion and/or plateable material.

30. The combination of claim 17 wherein said anodic material is deposited upon said cathodic material to a height that is substantially no greater than the height of a prescribed border of photoresist present only during fabrication.

31. The combination of claim 15 wherein said second metal is deposited upon said first metal to a height that is substantially no greater than the height of a prescribed border of photoresist, present only during fabrication.

32. The combination of claims 30 or 31 wherein the transitory photoresist border is approximately 0.1 to 0.2 mils wide.

33. A method for fabricating a pattern of a prescribed first metal on a substrate comprising the steps of:

depositing at least one second thin metallic layer on a relatively non-etchable substrate;

depositing a relatively narrow border of a given height of photoresist material on such metallic layer(s), said border outlining the configuration of a pattern of interest;

depositing said first metal on said second metal(s); said subsequent first metal characterized in tending to become anodic with said second metallic layer during a later etching;

removing said border of photoresist and thus exposing underlying portions of said second metallic layer(s);

removing said second thin metallic layer(s) in those areas exposed as above down to said substrate;

depositing photoresist to substantially cover the pattern of interest and to substantially fill the regions previously occupied by the border of photoresist down to the substrate, whereby to encapsulate the second metal substantially completely within the pattern of interest except for its contact area with the substrate;

etching away at least the first metal which is not so encapsulated; and removing all photoresist.

34. The combination as recited in claim 33 wherein the second metallic layers comprise a layer of adhesion metal applied on the substrate and a layer of plateable metal applied on the layer of adhesion-metal.

35. The combination as recited in claim 34 wherein the first metal is magnetic and relatively anodic.

36. The combination as recited in claim 35 wherein the first metal comprises a thin layer of magnetic ferrous metal.

37. The combination as recited in claim 36 wherein the adhesion metal comprises a metal such as Cr, Ti, Ta, Wf, Ni, Van or Zr apt for joining said ferrous metal firmly to the substrate.

38. The combination as recited in claim 37 wherein the substrate surface is comprised of a non-metal and the plateable metal is comprised of a layer of plateable metal like Au, Pt, Pd, Cu, Ni, Fe, or alloys thereof, tending to be relatively more plateable than said adhesion metal.

39. The combination as recited in claim 38 wherein the substrate surface comprises glass or a similar non-metal and the first metal includes Ni and Fe.

40. The combination as recited in claim 39 wherein the metal etching is done with $FeCl_3$ or a like etchant.

41. The product resulting from the method of claim 33.

42. The product resulting from the method of claim 40.

43. A method for fabricating a thin magnetic ferrous metal layer pattern on a substrate comprising the steps of:

depositing an adhesive and/or plating base material, which becomes cathodic during a subsequent etching process, upon a relatively non-etchable substrate surface;

placing a border of a given height of photoresist material on such cathodic material, said border outlining the configuration of a pattern of interest of subsequent anodic material to be deposited on said cathodic material;

depositing said relatively anodic magnetic ferrous material as a thin film on said cathodic material;

removing said border of photoresist and thus exposing said cathodic material;

removing all cathodic material in those areas underlying said border and exposed as above;

depositing photoresist to substantially cover the pattern of interest and to substantially fill the regions previously occupied by the border of photoresist whereby to substantially encapsulate the anodic material and underlying cathodic material within the pattern of interest;

etching away all the anodic and cathodic material not so encapsulated down to the substrate surface; and removing all photoresist.

44. The method of claim 43 wherein the material not encapsulated is removed by chemical etching.

45. The method of claim 36 wherein the adhesion metal and plateable metal layer(s) are removed by back-sputter etching in those areas exposed by removal of the border of photoresist.

46. The method of claim 34 wherein the second metallic layer(s) are removed by ion milling in those areas exposed by removal of the border of photoresist.

47. The method of claim 41 or 34 wherein substantially all adhesion and plateable base material is removed, down to the substrate, by back-sputter etching in those areas exposed by removal of the border of photoresist.

48. The method of claim 41 or 34 wherein substantially all adhesion and plateable base material is removed by ion milling in those areas exposed by removal of the border of photoresist.

49. The methods of claims 33 or 41 wherein the anodic material comprises an alloy of nickel and iron laid down in a very thin film.

50. A pole piece for a thin film head fabricated according to the method of claims 34 or 41.

51. The method of claim 33 wherein said first metal is electroplated on said second metal.

52. The method of claim 41 whrein said anodic material is electroplated on said adhesion and/or plateable base material.

53. The method of claim 33 wherein said first metal is deposited upon said second metal to a height that is substantially no greater than the height of the border of photoresist.

54. The method of claim 41 wherein said anodic material is deposited upon said cathodic material to a height that is substantially no greater than the height of the border of photoresist.

55. The method of claims 33 or 41 wherein the photoresist border is approximately 0.1 to 0.2 mils wide.

56. The product of the method of claim 43.

57. The product of the method of claim 49.

58. The product of the method of claim 55.

* * * * *

UNITED STATES PATENT AND TRADEMARK OFFICE
CERTIFICATE OF CORRECTION

PATENT NO. : 4,454,014
DATED : June 12, 1984
INVENTOR(S) : Peter G. Bischoff

It is certified that error appears in the above-identified patent and that said Letters Patent is hereby corrected as shown below:

Col. 4, line 19, change "sharp-edge" to --sharp-edged--.

Col. 5, line 19, change "in milling" to --ion milling--.

Signed and Sealed this

Ninth Day of October 1984

[SEAL]

Attest:

GERALD J. MOSSINGHOFF

*Attesting Officer*  *Commissioner of Patents and Trademarks*